(12) United States Patent
Wang et al.

(10) Patent No.: US 11,677,191 B2
(45) Date of Patent: Jun. 13, 2023

(54) ELECTRICAL CONNECTOR

(71) Applicant: Advanced Connectek Inc., New Taipei (TW)

(72) Inventors: Shu-Fen Wang, New Taipei (TW); Yi Hsu, New Taipei (TW)

(73) Assignee: Advanced Connectek Inc., New Taipei (TW)

(*) Notice: Subject to any disclaimer, the term of this patent is extended or adjusted under 35 U.S.C. 154(b) by 105 days.

(21) Appl. No.: 17/504,529

(22) Filed: Oct. 19, 2021

(65) Prior Publication Data
US 2022/0123507 A1 Apr. 21, 2022

(30) Foreign Application Priority Data
Oct. 20, 2020 (TW) ................................ 109213770

(51) Int. Cl.
| | | |
|---|---|---|
| *H01R 13/6581* | (2011.01) | |
| *H01R 13/6594* | (2011.01) | |
| *H01R 12/71* | (2011.01) | |
| *H01R 12/72* | (2011.01) | |
| *H01R 24/60* | (2011.01) | |
| *H01R 107/00* | (2006.01) | |
| *H01R 13/50* | (2006.01) | |
| *H05K 1/18* | (2006.01) | |
| *H01R 13/6591* | (2011.01) | |

(Continued)

(52) U.S. Cl.
CPC ......... *H01R 13/6581* (2013.01); *H01R 12/71* (2013.01); *H01R 12/716* (2013.01); *H01R 12/722* (2013.01); *H01R 13/6594* (2013.01); *H01R 12/712* (2013.01); *H01R 13/50* (2013.01); *H01R 13/502* (2013.01); *H01R 13/516* (2013.01); *H01R 13/6582* (2013.01); *H01R 13/6591* (2013.01); *H01R 24/60* (2013.01); *H01R 2107/00* (2013.01); *H01R 2201/06* (2013.01); *H05K 1/182* (2013.01); *H05K 2201/09072* (2013.01); *H05K 2201/10189* (2013.01); *H05K 2201/10446* (2013.01)

(58) Field of Classification Search
CPC .. H01R 13/6581; H01R 12/71; H01R 12/716; H01R 12/722; H01R 13/6594; H01R 12/712; H01R 13/50; H01R 13/502; H01R 13/516; H01R 13/6582; H01R 13/6591; H01R 24/60; H01R 2107/00; H01R 2201/06; H05K 1/182; H05K 2201/09072; H05K 2201/10189; H05K 2201/10446
See application file for complete search history.

(56) References Cited

U.S. PATENT DOCUMENTS 9,634,409 B2 * 4/2017 Tsai ................... H01R 43/0256

FOREIGN PATENT DOCUMENTS

CN 104901060 9/2015

* cited by examiner

*Primary Examiner* — Abdullah A Riyami
*Assistant Examiner* — Justin M Kratt
(74) *Attorney, Agent, or Firm* — JCIPRNET

(57) ABSTRACT

An electrical connector including an insulating body, a plurality of terminals disposed in the insulating body, a first metallic shell enclosing the insulating body to form an interface for being plugged by another electrical connector, and a second metallic shell is provided. The first metallic shell has a first soldering leg close to the interface, and the second metallic shell encloses the first metallic shell, wherein the first soldering leg extends away from the insulating body, penetrates the second metallic shell and protrudes out of the second metallic shell.

20 Claims, 4 Drawing Sheets

(51) Int. Cl.
*H01R 13/502* (2006.01)
*H01R 13/516* (2006.01)
*H01R 13/6582* (2011.01)

ELECTRICAL CONNECTOR

CROSS-REFERENCE TO RELATED APPLICATION

This application claims the priority benefit of Taiwan application serial no. 109213770, filed on Oct. 20, 2020. The entirety of the above-mentioned patent application is hereby incorporated by reference herein and made a part of this specification.

BACKGROUND

Technical Field

The disclosure relates to an electrical connector.

Description of Related Art

As the amount of data transmitted between most of the electronic devices continues to increase, in order to provide users with a more user-friendly experience, the speed of signal transmission between most of the electronic devices is increased accordingly. Electrical connectors are a kind of electronic signal communication bridge between different electronic devices, and therefore are frequently applied to various electronic devices because of the aforementioned situations.

However, under the trend of miniaturizing the electronic devices, the overall volume of the electrical connector is also required to be reduced into a miniaturized design. Consequently, the structural stability of the electrical connector packaged on the circuit board is affected and the structural stability is prone to decrease gradually as the number of times of use (docking, plugging, and pulling) of the electrical connector increases.

It is known that Chinese Patent No. CN104901060 provides a socket connector, wherein the tongue plate of the insulating body is surrounded by a shielding housing, then a metal cover is fixed to the outside of the shielding housing, and the socket connector is supported on the circuit board through the supporting legs of the metal cover. However, in terms of the connection structure between the socket connector and the circuit board, the connection structure is actually assembled from the inside out. In other words, the connection structure may rely solely on the ability of structural connection between the insulating body, the shielding housing, the metal cover, and the circuit board where additional structural strength is not guaranteed. Therefore, this type of assembly may still have a certain risk of separation.

Accordingly, how to effectively improve the structural strength of the electrical connector on the circuit board under the aforementioned trend is an issue that relevant technicians need to consider and solve.

SUMMARY

The disclosure provides an electrical connector, which improves the structural strength and appearance integrity of the electrical connector by using a double housing structure and interlocking pins.

The electrical connector according to the disclosure includes an insulating body, a plurality of terminals, a first metallic shell and a second metallic shell. The terminals are disposed in the insulating body. The first metallic shell encloses the insulating body to form an interface, and the interface is suitable for being connected to another electrical connector. The first metallic shell has a first soldering leg close to the interface. The second metallic shell encloses the first metallic shell. Among them, the first soldering leg extends away from the insulating body, penetrates and protrudes out of the second metallic shell.

The electrical connector according to the disclosure includes an insulating body, a plurality of terminals, a first metallic shell and a second metallic shell. The insulating body comprises a tongue portion, a thickened step portion and a base portion, wherein the thickened step portion is at a root of the tongue portion and adjacent to the base portion. The terminals are disposed on a top surface and a bottom surface of the tongue portion of the insulating body and held in the base portion of the insulating body. The first metallic shell encloses the insulating body to form an insertion opening and an insertion space, the insertion opening and the insertion space is suitable for being plugged by another electrical connector, and the first metallic shell has a first soldering leg close to the insertion opening. The second metallic shell encloses the first metallic shell, wherein the first soldering leg extends away from the insulating body, penetrates and protrudes out of the second metallic shell.

In an embodiment of the disclosure, the first metallic shell further includes a second soldering leg, which is far away from the interface, setting a distance between the first soldering leg and the interface smaller than a distance between the second soldering leg and the interface.

In an embodiment of the disclosure, the electrical connector is adapted to be fixed on a circuit board through the first soldering leg and the second soldering leg, and a part of the electrical connector is suspended in a recess of the circuit board.

In an embodiment of the disclosure, the first soldering leg and the second soldering leg are coplanar.

In an embodiment of the disclosure, the second metallic shell has a gap facing away from the interface. The first soldering leg passes through the gap, and penetrates and protrudes out of the second metallic shell.

In an embodiment of the disclosure, the insulating body has a stepped structure and a tongue portion, the tongue portion is extended from the base portion, the stepped structure includes a thickened step portion and a rearward extended portion, and the thickened step portion is located at a root of the tongue portion. The rearward extended portion is higher than the thickened step portion. The first metallic shell has another stepped structure, including a main frame portion and a rearward step portion, and the rearward step portion is higher than the main frame portion. The main frame portion surrounds the thickened step portion. The rearward step portion covers the rearward extended portion.

In an embodiment of the disclosure, the second metallic shell encloses the thickened step portion and the main frame portion.

In an embodiment of the disclosure, the second metallic shell has a bend extending to the rearward extended portion, and the insulating body further includes a base portion connected between the thickened step portion and the rearward extended portion, and a depression located at a bottom surface of the base portion. The bend is locked into the depression.

In an embodiment of the disclosure, the first metallic shell further includes a second soldering leg. The first soldering leg is located at the main frame portion. The second soldering leg is located at the rearward step portion. The first soldering leg and the second soldering leg are coplanar.

In an embodiment of the disclosure, the first metallic shell includes a hollow portion. An outline of the hollow portion corresponds to the first soldering leg. The second metallic shell covers the hollow portion.

In an embodiment of the disclosure, the first metallic shell has an opening, and an inner wall of the second metallic shell has a locking protrusion. The locking protrusion is locked into the opening to assemble the first metallic shell and the second metallic shell.

In an embodiment of the disclosure, the second metallic shell has a bend, which is far away from the interface and protrudes from the first metallic shell through a gap of the first metallic shell, so as to be locked into a depression of the insulating body.

In an embodiment of the disclosure, the electrical connector further comprises a metallic plate embedded inside the tongue portion to form a mid-plate located between both sides of the tongue portion, wherein two side edges of the mid-plate are respectively exposed on two sides of the tongue portion.

In an embodiment of the disclosure, the first metallic shell further includes a second soldering leg, which is far away from the insertion opening, setting a distance between the first soldering leg and the insertion opening smaller than a distance between the second soldering leg and the insertion opening.

In an embodiment of the disclosure, the second metallic shell has a gap facing away from the insertion opening. The first soldering leg passes through the gap, and penetrates and protrudes out of the second metallic shell.

In an embodiment of the disclosure, the insulating body further comprises a rearward extended portion, the rearward extended portion is higher than the thickened step portion, the first metallic shell comprises a main frame portion and a rearward step portion, the rearward step portion is higher than the main frame portion, the main frame portion surrounds the thickened step portion and the tongue portion, and the rearward step portion covers the rearward extended portion.

In an embodiment of the disclosure, the second metallic shell encloses the thickened step portion, the tongue portion and the main frame portion.

Based on the above, the electrical connector forms an interface by firstly enclosing the insulating body with the first metallic shell, and the first metallic shell has the first soldering leg extending out. Among them, the first soldering leg is close to the interface, and then the second metallic shell is disposed to enclose the first metallic shell so that the first soldering leg may penetrate and protrude out of the second metallic shell when extending away from the insulating body. Accordingly, in addition to the overlapping relationship between the second metallic shell and the first metallic shell, the structural design of the first soldering leg penetrating and protruding out of the second metallic shell also improves the structural strength of the electrical connector.

Furthermore, when the electrical connector is plugged into, pulled from or docked with another electrical connector, the plugging and pulling force applied by the user simultaneously affects the insulating body, the first metallic shell and the second metallic shell. The first soldering leg of the first metallic shell on the inner layer further penetrates and protrudes out of the second metallic shell on the outer layer. Apparently, the first metallic shell and the second metallic shell form an interlocking structure. In other words, along the direction of plugging and pulling, the insulating body, the first metallic shell and the second metallic shell form a state of interference to withstand and effectively resist the aforementioned plugging and pulling force applied by the user.

DETAILED DESCRIPTION OF DISCLOSED EMBODIMENTS

Figure 1:
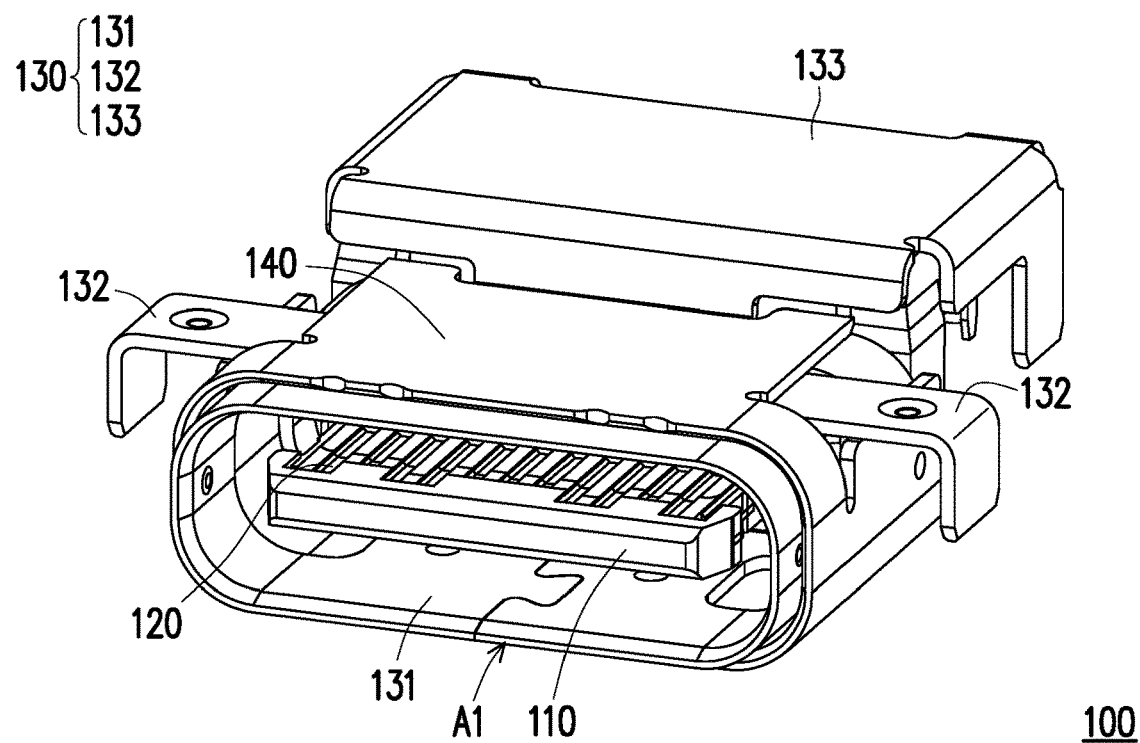
FIG. 1 and FIG. 2 are respectively schematic views of an electrical connector according to an embodiment of the disclosure from different viewing angles.
Figure 2:
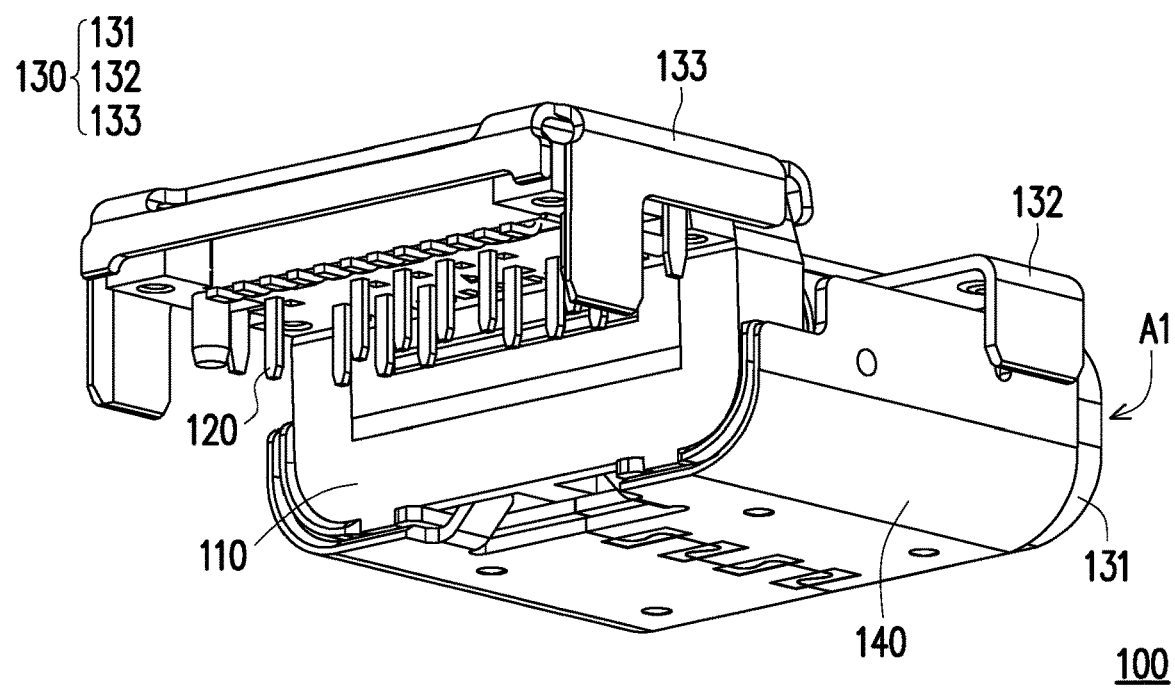

FIG. 1 and FIG. 2 are respectively schematic views of an electrical connector according to an embodiment of the disclosure from different viewing angles. Referring to FIG. 1 and FIG. 2, in this embodiment, the electrical connector 100 is, for example, a miniaturized USB Type-C electrical connector, which includes an insulating body 110, a plurality of terminals 120, a first metallic shell 130, and a second metallic shell 140. The terminals 120 are disposed on the insulating body 110 by, for example, insert molding. The first metallic shell 130 encloses the insulating body 110 to form an interface A1, and the interface A1 includes an insertion opening and an insertion space which are suitable for being plugged by another electrical connector (not shown). The first metallic shell 130 has a first soldering leg 132a close to the interface A1. The second metallic shell 140 encloses the first metallic shell 130. Among them, the first soldering leg 132a extends away from the insulating body 110, and penetrates and protrudes out of the second metallic shell 140.

Figure 3:
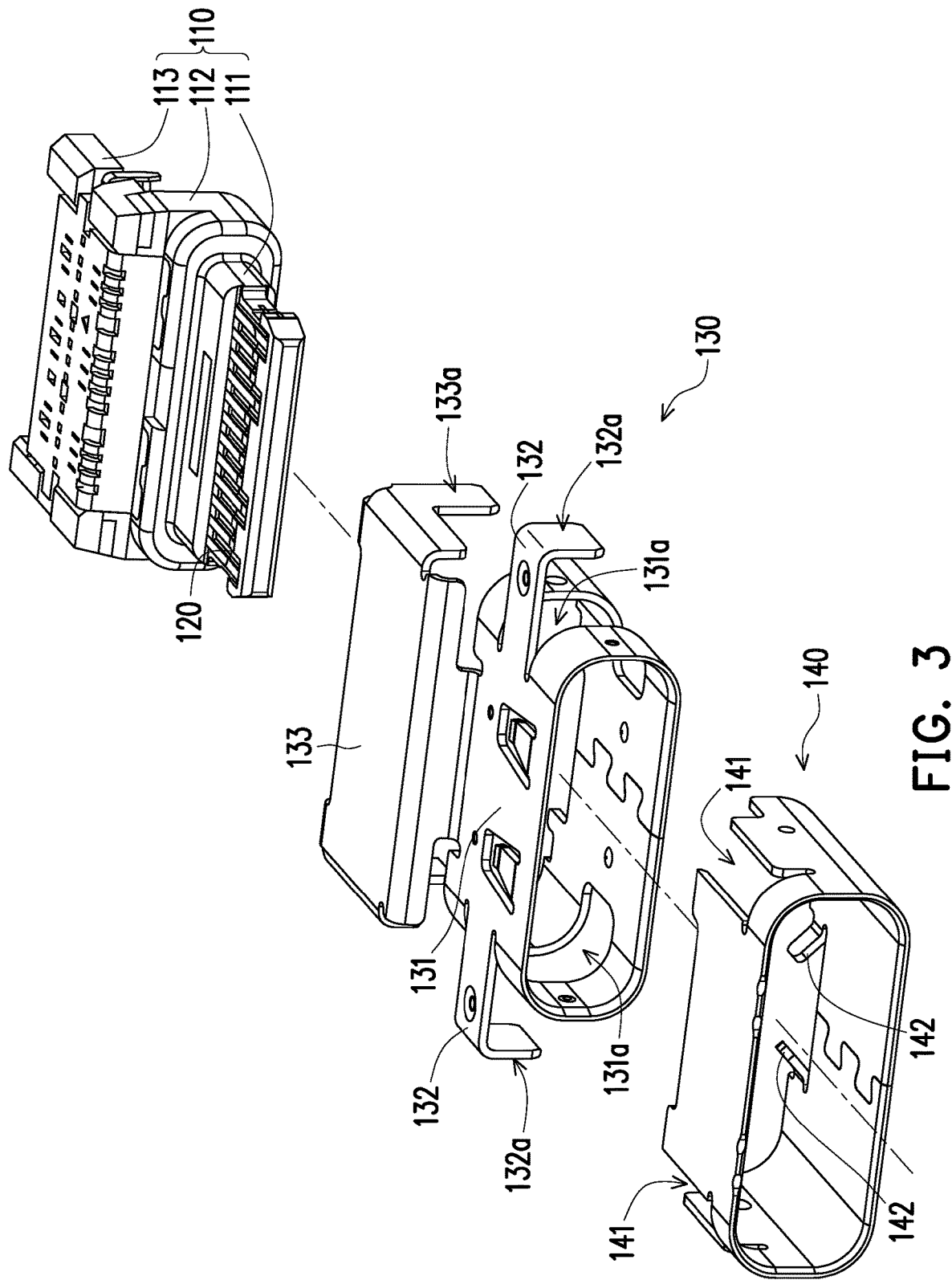
FIG. 3 and FIG. 4 are respectively exploded views of the electrical connector from different viewing angles.
Figure 4:
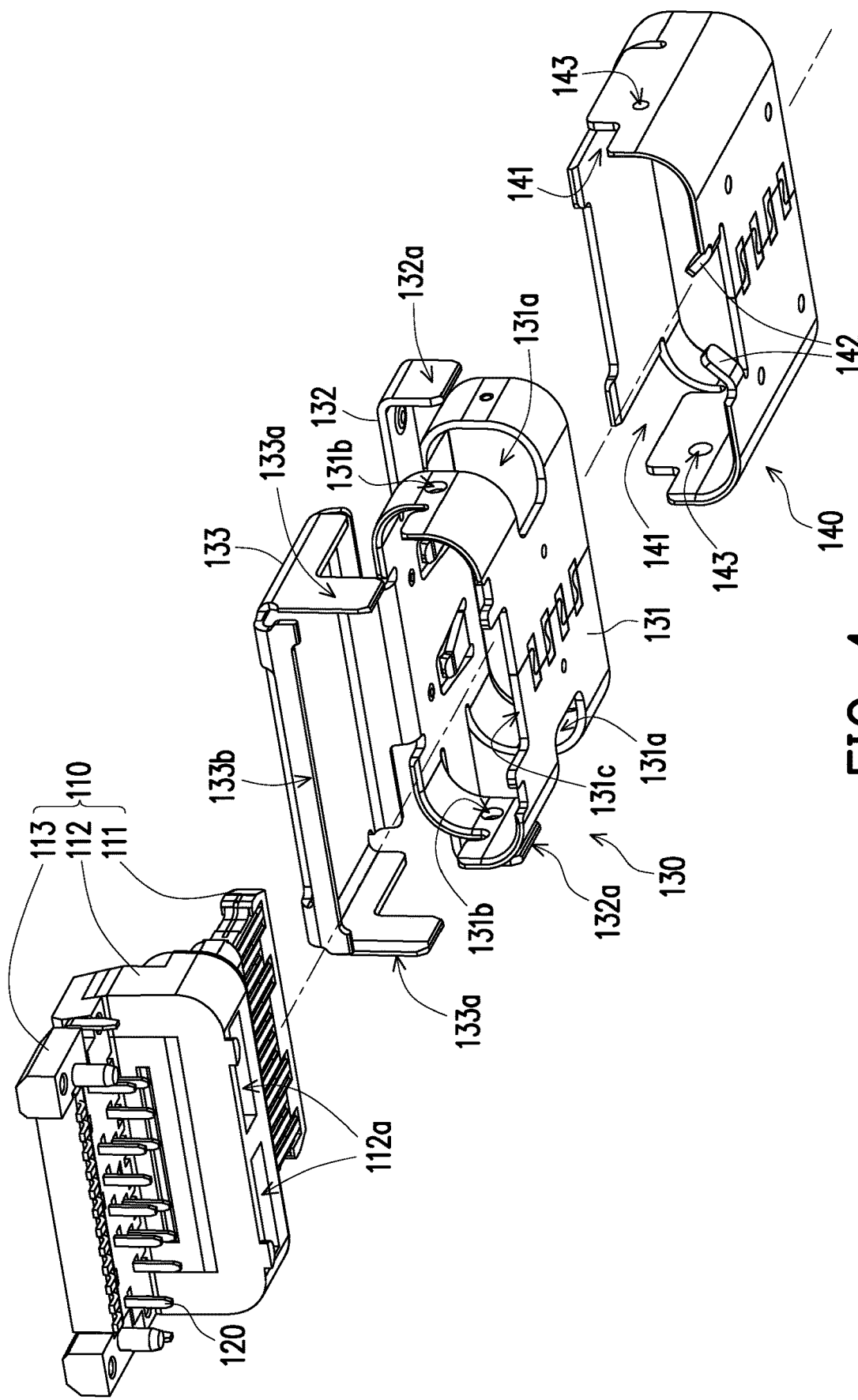

FIG. 3 and FIG. 4 are respectively exploded views of the electrical connector from different viewing angles. Referring to FIG. 3 and FIG. 4 in comparison with FIG. 1 or FIG. 2, in this embodiment, the materials of the first metallic shell 130 and the second metallic shell 140 are both conductive metals. The first metallic shell 130 further has a second soldering leg 133a which is far from the interface A1. In other words, the distance between the first soldering leg 132a and the interface A1 (the insertion opening) is set smaller than the distance between the second soldering leg 133a and the interface A1 (the insertion opening). For the first metallic shell 130, the first soldering leg 132a is substantially located between the interface A1 and the second soldering leg 133a. Furthermore, the second metallic shell 140 has a gap 141 facing away from the interface A1. The first soldering leg 132a of the first metallic shell 130 passes through the gap 141, and penetrates and protrudes out of the second metallic shell 140.

In detail, the insulating body 110 includes a tongue portion, a thickened step portion 111, a base portion 112 and a rearward extended portion 113. The tongue portion is extended from the base portion 112 along an insertion direction. The terminals 120 are disposed on a top surface and a bottom surface of the tongue portion and held in the base portion 112 of the insulating body 110. The thickened step portion 111 is located at a root of the tongue portion and adjacent to the base portion 112. Among them, the rearward extended portion 113 is higher than the thickened step portion 111 along a vertical direction perpendicular to the insertion direction. The base portion 112 is connected between the thickened step portion 111 and the rearward extended portion 113. Accordingly, the first metallic shell 130 of this embodiment needs to correspond to the insulating body 110 and also forms another stepped structure. In other words, the first metallic shell 130 is processed by stamping, bending, etc. with metal plates to form a stepped structure. The first metallic shell 130 includes a main frame portion 131, a rearward step portion 133 and an extension portion. The extension portion of the first metallic shell 130 is connected between the main frame portion 131 and the rearward step portion 133. Among them, the rearward step portion 133 is higher than the main frame portion 131 along the vertical direction. In the embodiment, the second metallic shell 130 is formed with wing portions 132 extending away from each other from the main frame portion 131 at the same time. The first soldering leg 132a is the end bending structure of the wing portion 132. When the first metallic shell 130 encloses the insulating body 110, the main frame portion 131 surrounds the thickened step portion 111 and the tongue portion, and the rearward step portion 133 covers the rearward extended portion 113, so as to cover and hold the insulating body 110 at the same time. When the second metallic shell 140 is assembled outside the first metallic shell 130, the second metallic shell 140 substantially encloses the thickened step portion 111, the tongue portion and the main frame portion 131. Furthermore, while the wing portion 132 is stamped out of the first metallic shell 130, a hollow portion 131a located below the wing portion 132 is formed and the outline of the hollow portion 131a corresponds to the first soldering leg 132a. After the second metallic shell 140 is disposed to enclose the main frame portion 131, the second metallic shell 140 substantially covers the hollow portion 131a, so that the electrical connector 100 has integrity in appearance.

In addition, as shown in FIG. 4, the first metallic shell 130 has an opening 131b located at the main frame portion 131. The inner wall of the second metallic shell 140 has a locking protrusion 143, which is inserted and locked into the opening 131b so as to smoothly lock and assemble the first metallic shell 130 and the second metallic shell 140 together. In the first metallic shell 130 of the embodiment, the rearward step portion 133 extends from the main frame portion 131 to form a cover body with a four-sided bending side plate. As shown in FIG. 4, the four-sided bending side plate includes a pair of second soldering legs 133a opposite to each other, and the rearward step portion 133 also has a rear side plate 133b, which faces the junction of the rearward step portion 133 and the main frame portion 131. The cover body covers the rearward extended portion 113 of the insulating body 110, and provides the function of holding insulating body 110 and protecting terminals 120. Furthermore, the terminals 120 of a USB Type-C electrical connector are respectively disposed on a top surface and a bottom surface of the tongue portion of the insulating body 110 and a metallic plate is embedded inside the tongue portion to form a mid-plate located between both sides of the tongue portion. Two side edges of the mid-plate are respectively exposed on two sides of the tongue portion.

Further, referring to FIG. 4 in comparison with FIG. 2, in this embodiment, the second metallic shell 140 has a bend 142. The bend 142 is far away from the interface A1 and protrudes from the main frame portion 131 of the first metallic shell 130 through the gap 131c of the first metallic shell 130. The bend 142 substantially extends from the outside to the inner space of the first metallic shell 130 to be further locked into a depression 112a of the insulating body 110. To be more specific, the bend 142 extends to the rearward extended portion 113 of the insulating body 110, and the bottom surface of the base portion 112 of the insulating body 110 has the depression 112a located on the extension path of the bend 142, allowing the bend 142 to be smoothly inserted and locked into the depression 112a, which further provides a resistance between the insulating body 110 and the second metallic shell 140 that is sufficient to resist the aforementioned force of plugging and pulling.

Figure 5:
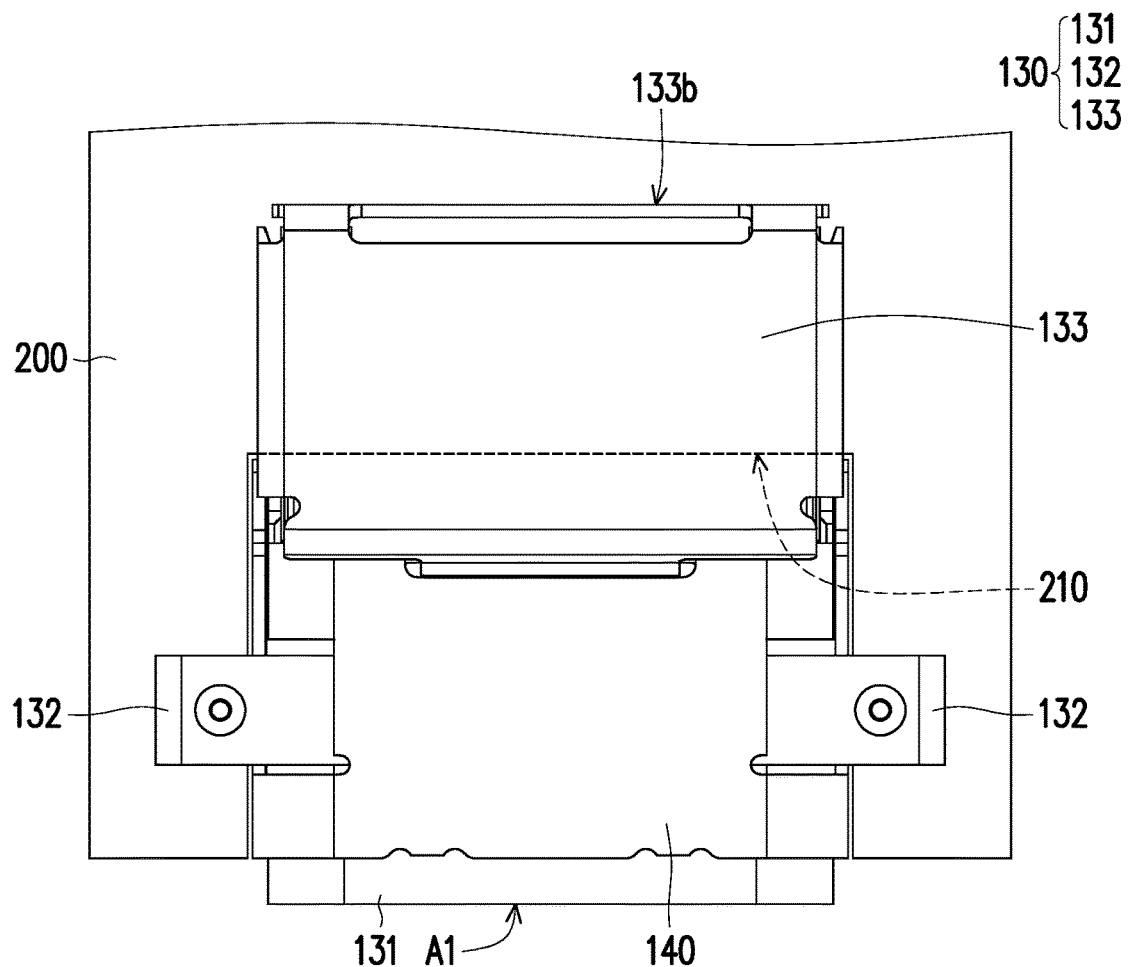
FIG. 5 is a top view of the electrical connector disposed on a circuit board.
Figure 6:
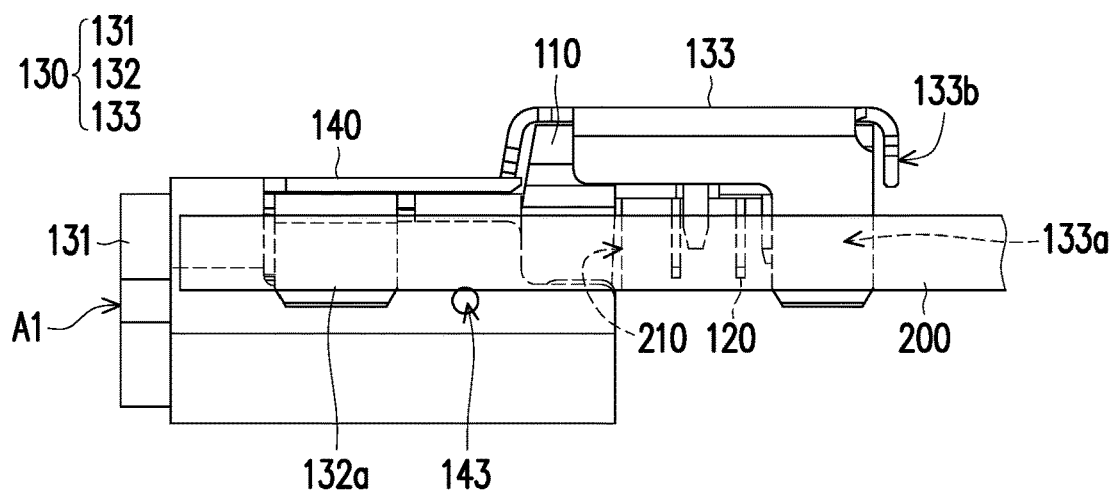
FIG. 6 is a side view of the electrical connector of FIG. 5.

FIG. 5 is a top view of the electrical connector disposed on a circuit board. FIG. 6 is a side view of the electrical connector of FIG. 5. Please refer to FIG. 5 and FIG. 6. In this embodiment, the electrical connector 100 is adapted to be fixed to the circuit board 200 through the first soldering legs 132a and the second soldering legs 133a, and a part of the electrical connector 100 is suspended in a recess 210 of the circuit board 200 to form a sinking plate type electrical connector. Accordingly, although the first metallic shell 130 has a stepped structure, the first soldering legs 132a located at the main frame portion 131 and the second soldering legs 133a located at the rearward step portion 133 are still in a coplanar state, so as to facilitate the insertion on the same surface of the circuit board 200 without changing the structural design of the circuit board 200.

In summary, in the aforementioned embodiment of the disclosure, the electrical connector forms an interface by firstly enclosing the insulating body with the first metallic shell, and the first metallic shell has the first soldering leg extending out. Among them, the first soldering leg is close to the interface, and then the second metallic shell is disposed to enclose the first metallic shell, so that the first soldering leg may protrude out of the second metallic shell when extending away from the insulating body. Accordingly, in addition to the overlapping relationship between the second metallic shell and the first metallic shell, the structural design of the first soldering leg penetrating and protruding out of the second metallic shell also improves the structural strength of the electrical connector. When the electrical connector is plugged into, pulled from or docked with another electrical connector, the plugging and pulling force applied by the user affects the insulating body, the first metallic shell and the second metallic shell at the same time. In addition, the first soldering leg of the first metallic shell on the inner layer further penetrates and protrudes out of the second metallic shell on the outer layer. Apparently, the first metallic shell and the second metallic shell form an interlocking structure. In other words, along the direction of plugging and pulling, the insulating body, the first metallic shell and the second metallic shell of the electrical connector form a state of interference.

Accordingly, the first metallic shell and the second metallic shell form a double housing structure outside of the insulating body, and the first soldering leg and the second metallic shell further interfere with each other to form the interlocking pin structure of the electrical connector. In addition, any two of the insulating body, the first metallic shell, and the second metallic shell are in a state of interlocking with each other or structurally interfering with each other, which helps strengthen the strength of the connection between the components and improve the resistance of the electrical connector to the plugging and pulling force applied by the user. The first metallic shell and the second metallic shell also provide a better electromagnetic shielding effect during the signal transmission.

What is claimed is:

1. An electrical connector, comprising:
   an insulating body;

a plurality of terminals disposed in the insulating body;
a first metallic shell enclosing the insulating body to form an interface, the interface being suitable for being plugged by another electrical connector, and the first metallic shell having a first soldering leg close to the interface; and
a second metallic shell enclosing the first metallic shell, wherein the first soldering leg extends away from the insulating body, penetrates and protrudes out of the second metallic shell.

2. The electrical connector according to claim 1, wherein the first metallic shell further comprises a second soldering leg, which is far away from the interface, setting a distance between the first soldering leg and the interface smaller than a distance between the second soldering leg and the interface.

3. The electrical connector according to claim 2, wherein the electrical connector is adapted to be fixed on a circuit board through the first soldering leg and the second soldering leg, and a part of the electrical connector is suspended in a recess of the circuit board.

4. The electrical connector according to claim 2, wherein the first soldering leg and the second soldering leg are coplanar.

5. The electrical connector according to claim 1, wherein the second metallic shell comprises a gap facing away from the interface, and the first soldering leg passes through the gap, and penetrates and protrudes out of the second metallic shell.

6. The electrical connector according to claim 1, wherein the insulating body comprises a stepped structure and a tongue portion, the tongue portion is extended from the base portion, the stepped structure comprises a thickened step portion and a rearward extended portion, the thickened step portion is located at a root of the tongue portion, the rearward extended portion is higher than the thickened step portion, the first metallic shell comprises another stepped structure, the first metallic shell comprises a main frame portion and a rearward step portion, the rearward step portion is higher than the main frame portion, the main frame portion surrounds the thickened step portion and the tongue portion and the rearward step portion covers the rearward extended portion.

7. The electrical connector according to claim 6, wherein the second metallic shell encloses the thickened step portion and the main frame portion.

8. The electrical connector according to claim 6, wherein the second metallic shell comprises a bend extending to the rearward extended portion, and the insulating body further comprises a base portion connected between the thickened step portion and the rearward extended portion and a depression located at a bottom surface of the base portion, wherein the bend is locked into the depression.

9. The electrical connector according to claim 6, wherein the first metallic shell further comprises a second soldering leg, the first soldering leg is located at the main frame portion, the second soldering leg is located at the rearward step portion, and the first soldering leg and the second soldering leg are coplanar.

10. The electrical connector according to claim 1, wherein the first metallic shell comprises a hollow portion wherein an outline of the hollow portion corresponds to the first soldering leg and the second metallic shell covers the hollow portion.

11. The electrical connector according to claim 1, wherein the first metallic shell comprises an opening wherein an inner wall of the second metallic shell comprises a locking protrusion, and the locking protrusion is locked into the opening to assemble the first metallic shell and the second metallic shell.

12. The electrical connector according to claim 1, wherein the second metallic shell comprises a bend which is far away from the interface and protrudes from the first metallic shell through a gap of the first metallic shell to be locked into a depression of the insulating body.

13. An electrical connector, comprising:
an insulating body comprising a tongue portion, a thickened step portion and a base portion, wherein the thickened step portion is at a root of the tongue portion and adjacent to the base portion;
a plurality of terminals disposed on a top surface and a bottom surface of the tongue portion of the insulating body and held in the base portion of the insulating body;
a first metallic shell enclosing the insulating body to form an insertion opening and an insertion space, the insertion opening and the insertion space being suitable for being plugged by another electrical connector, and the first metallic shell having a first soldering leg close to the insertion opening; and
a second metallic shell enclosing the first metallic shell, wherein the first soldering leg extends away from the insulating body, penetrates and protrudes out of the second metallic shell.

14. The electrical connector according to claim 13, further comprising a metallic plate embedded inside the tongue portion to form a mid-plate located between both sides of the tongue portion, wherein two side edges of the mid-plate are respectively exposed on two sides of the tongue portion.

15. The electrical connector according to claim 13, wherein the first metallic shell further comprises a second soldering leg, which is far away from the insertion opening, setting a distance between the first soldering leg and the insertion opening smaller than a distance between the second soldering leg and the insertion opening.

16. The electrical connector according to claim 15, wherein the electrical connector is adapted to be fixed on a circuit board through the first soldering leg and the second soldering leg, and a part of the electrical connector is suspended in a recess of the circuit board.

17. The electrical connector according to claim 15, wherein the first soldering leg and the second soldering leg are coplanar.

18. The electrical connector according to claim 13, wherein the second metallic shell comprises a gap facing away from the insertion opening, and the first soldering leg passes through the gap, and penetrates and protrudes out of the second metallic shell.

19. The electrical connector according to claim 13, wherein the insulating body further comprises a rearward extended portion, the rearward extended portion is higher than the thickened step portion, the first metallic shell comprises a main frame portion and a rearward step portion, the rearward step portion is higher than the main frame portion, the main frame portion surrounds the thickened step portion and the tongue portion, and the rearward step portion covers the rearward extended portion.

20. The electrical connector according to claim 19, wherein the second metallic shell encloses the thickened step portion, the tongue portion and the main frame portion.

* * * * *